(12) United States Patent
Hua

(10) Patent No.: US 8,729,742 B2
(45) Date of Patent: May 20, 2014

(54) ENERGY BORROWING TO REDUCE SYSTEM VOLTAGE DROP

(75) Inventor: Hao Hua, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 460 days.

(21) Appl. No.: 13/164,273

(22) Filed: Jun. 20, 2011

(65) Prior Publication Data

US 2012/0319764 A1    Dec. 20, 2012

(51) Int. Cl.
*H01H 9/54* (2006.01)

(52) U.S. Cl.
USPC .......................................... 307/140

(58) Field of Classification Search
USPC .......................................... 307/140
See application file for complete search history.

(56) References Cited

U.S. PATENT DOCUMENTS

2004/0124821 A1* 7/2004 Elkin et al. .................... 323/303

* cited by examiner

*Primary Examiner* — Robert L. Deberadinis
(74) *Attorney, Agent, or Firm* — Sterne, Kessler, Goldstein & Fox P.L.L.C.

(57) ABSTRACT

An integrated circuit (IC) includes a first section having a sinking component sinking excessive current. A second section includes at least one sourcing component that, in operation, stores energy. A structure is provided to provide the stored energy from the at least one sourcing component to the sinking component, the stored energy being utilized by a load component included within the second section.

17 Claims, 6 Drawing Sheets

High Resolution Equivalent Path

ENERGY BORROWING TO REDUCE SYSTEM VOLTAGE DROP

BACKGROUND OF THE INVENTION

1. Field of the Invention

This application relates generally to the design of integrated circuits (IC), and to boosting the performance of the ICs by supplying additional and/or unused stored energy to a sinking component, controlling excessive sinking of current or voltage at the sinking component, thereby allowing the supply voltage to remain stable.

2. Background Art

In an integrated circuit (IC), loss of power can occur due to excessive sinking of current, dragging down voltage at a sinking component in a particular section of the circuit. This can create a bottleneck which limits system performance of the integrated circuit (IC). For example, a high switching component included in the particular section of the IC may sink a lot of current, and consequently lower the main supply voltage of the IC by pulling-down the supply voltage to ground. The lowering of the supply voltage results in poor performance of the IC.

As such, to boost the performance of the IC, there is a need to fix the above bottleneck which causes the drop in the supply voltage.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

Figure 1:
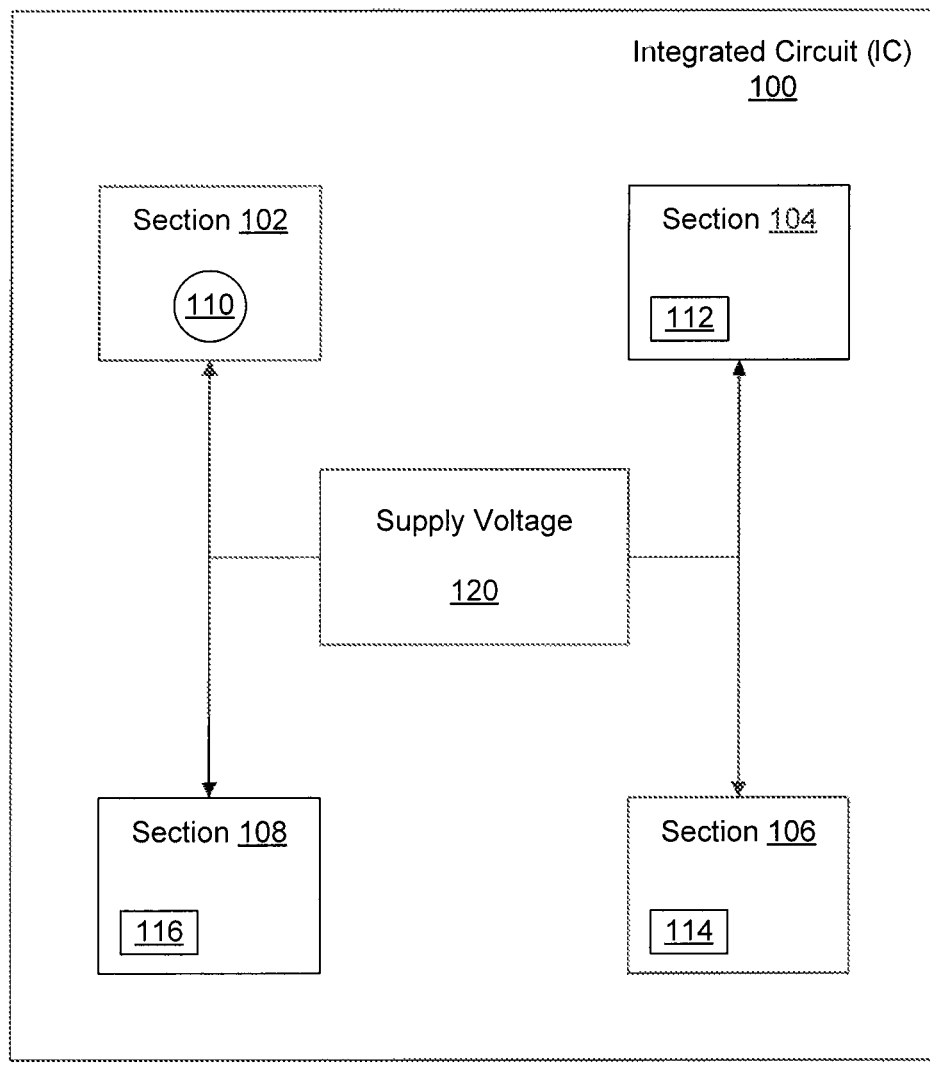
FIG. 1 illustrates a block diagram of a conventional integrated circuit including a sinking component.

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

As discussed above, to boost the performance of the IC, there is a need to fix the excessive sinking of current or voltage at the sinking component in the particular section of the circuit.

One way to fix the bottleneck is to add additional decoupling capacitors in the particular section of the circuit to provide more current/charge/power to the switching component of the particular section to satisfy the current/charge/power requirement of the switching component. However, it is not desirable to include additional decoupling capacitors because these capacitors are available in bigger packages and are not suitable for the ever decreasing sizes of the ICs. Further, the additional decoupling capacitors would lead to undesirable increase in cost to manufacture the IC.

Another way to fix the bottleneck is to provide more current/charge/power to the switching component of the particular section to satisfy the current/charge/power requirement of the switching component via a source external to the IC. However, connecting the external source to the switching component is undesirable because it involves designing a complex layout (routing) system which complicates the design of the IC.

In one embodiment of the invention described herein, an integrated circuit (IC) includes a first section including a sinking component sinking excessive current, at least one second section including at least one sourcing component having stored energy, and a structure to provide the stored energy from the at least one sourcing component to the sinking component, the stored energy being dedicated for a load means included within the at least one second section.

In another embodiment of the invention, an integrated circuit (IC) includes a first section including a sinking means sinking excessive current, at least one second section including at least one sourcing means controlling stored energy, and a supplying means to supply the stored energy from the at least one sourcing means to the sinking means, the stored energy being dedicated for a load means included within the at least one second section An embodiment of the invention provides a solution to the above-described potential bottleneck without including additional decoupling capacitors and without designing a complex system to provide the required current/charge/power from an external source.

This is accomplished by providing a simple structure to leverage energy stored in a source component (e.g., decoupling capacitor) included in another section of the circuit, other than the particular section which includes the sinking component.

The use of the simple structure is based on Applicants' recognition that the another section of the circuit includes source components having additional and/or unused stored energy (charge), which energy which is dedicated for use by components (e.g., load or switching) included in the another section, and that this additional and/or unused stored energy can be provided to the sinking component of the particular section to satisfy the current/charge/power requirement of the sinking component.

As such, the additional and/or unused energy stored in the source components of the another section of the circuit can be supplied to the sinking component, thereby controlling the excessive sinking of current or voltage at the sinking component.

Therefore, to boost the performance of the IC, an exemplary embodiment of the present invention includes the simple structure that supplies the additional and/or unused stored energy to the sinking component, controls the excessive sinking of current or voltage at the sinking component, and allows the supply voltage to remain stable.

FIG. 1 illustrates an integrated circuit (IC) 100 including sections 102, 104, 106, 108. Each of these sections 102, 104, 106, 108 includes respective circuitry and components.

Section 102 includes a sinking component 110 which, for example, could be a switching component such as a transistor. The sinking component 110, during operation, sinks excessive current and thereby pulls down a main supply voltage 120 supplying power to section 102 and all other sections 104, 106, 108.

The pulling down of the supply voltage 120 causes fluctuations in the supply voltage and effects operation of the circuitry in all the sections being supplied by supply voltage 120, thereby resulting in poor performance of the IC 100.

Sections 104, 106, 108 of the integrated circuit include respective components, for example, coupling capacitors, which are dedicated to storing energy for respective load components within sections 102, 106, 108, and may have additional and/or unused energy stored in them.

Applicants have recognized that this additional and/or unused energy can be provided to the sinking component 110 of section 102 in order to supply the sinking component 110 with additional current to satisfy the requirement of the sinking component 110 and to eliminate the excessive sinking of current at the sinking component 110. However, no simple structure to supply this additional and/or stored energy from source components 112, 114, 116 to the sinking component 110 has been devised.

Energy stored in source components 112, 114, 116 cannot directly be provided to the sinking component 110 because such connections would have to be provided through the respective circuits of sections 104, 106, 108, and these connections would have a very high resistance. As such, connecting the energy storing source components 112, 114, 116 to the sinking component 110 of section 102 through respective circuitry of sections 104, 106, 108 would not be useful because a lot of this energy would be lost while being supplied through the high resistance connections.

Figure 2:
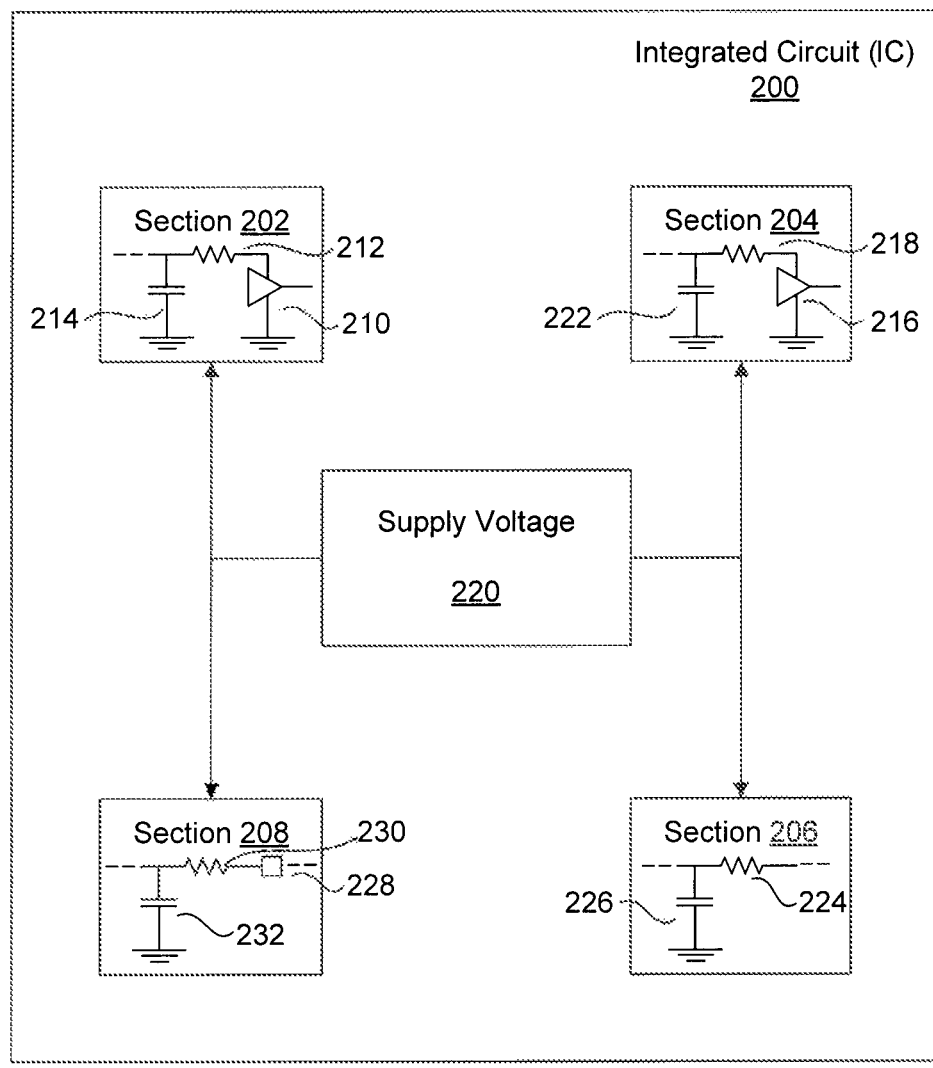
FIG. 2 illustrates exemplary components included in sections of the conventional integrated circuit.

Further, the above high resistance connections are undesirable because the energy, while being supplied through the high resistance structure would require a significant fly time to reach the sinking component 210 of IC 200 shown in FIG. 2, the fly time being greater than, for example, the sinking transition time of the sinking component 210 in most cases.

In particular, when charges are supplied via a high resistance connection from source components 222, 226, 232, which are designed to store energy dedicated for other components 216, 228 and are located further away from the sinking component 210, the supplied charges require a significant fly time to reach the sinking component 210. This fly time is defined by $\tau=RC$, where $\tau$ is the fly time, R is the associated resistance of the high resistance connection, and C is the associated capacitance of the high resistance connection.

When the fly time is larger than the (gate) switching transition time (about 10-100 ps) of the sinking component 210, the source components 222 (218), 226 (224), 232 (230) located (in sections 204, 206, 208) further away from the sinking component 210 (in section 202) are not able to provide the required energy in time.

Furthermore, the borrowed energy from source components 222, 226, 232 located further from the sinking component 210 includes a significant portion of high frequency current components which are undesirable for proper operation of the switching component 210.

Finally, during the switching transition, the sinking component 210 also receives charges from source components 214 (212) designed to store energy dedicated for the sinking component 210. However, in most cases, the charges stored in the source components 212 (214) are not enough to satisfy the requirement of the sinking component 210, leading to excessive sinking.

Figure 3:
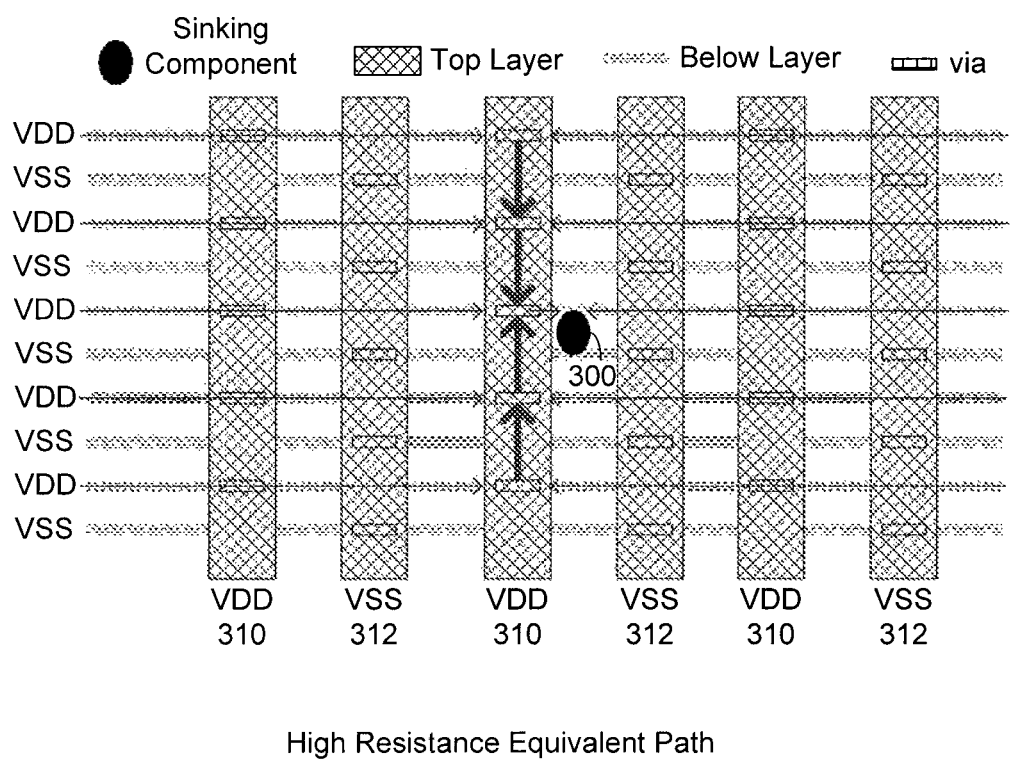
FIG. 3 illustrates the top view of an IC die layout of the conventional integrated circuit.

FIG. 3 shows an IC die layout including a power-ground mesh (310, 312) of the conventional IC shown in FIGS. 1 and 2. It can be seen that when charges are supplied from source components, which are designed to store energy dedicated for other components and are located further away from the sinking component 300, the supplied charges travel via an equivalent high resistance path to the sinking component 300. In particular, the supplied charges travel from the far away source components through high resistance VDD routing on lower layers reaching the VDD routing 310 on the top layer and then to the sinking component 300.

As discussed above, the traveling of the supplied charges via the equivalent high resistance path to the sinking component 300 results in a high loss of the supplied charges and also requires a significant fly time. As such, additional charges supplied via the equivalent high resistance path are unable to satisfy the requirements of the sinking component 300, and thereby unable to prevent the excessive sinking of current at the sinking component 300.

Based on the above observations, Applicants have recognized that the voltage drop in the supply voltage due to the excessive sinking depends on the impedance in the die layout of the IC and the amount of current sunk by the sinking component. In an IC design, the sinking component is an important node where the voltage drop in the supply voltage can be optimized.

Therefore, to minimize the sinking current, both, the die impedance and on-die decoupling should be optimized. The die impedance can be optimized by forming solid power/ground planes for better in-package routing in the IC.

However, in cost driven designs, the metal resources available for die and in-package routing are very limited. For example, in a two layer substrate design, it is difficult to form solid power/ground planes in the package. Therefore, the on-die decoupling optimization becomes vital for success of a hi-performance, low-cost design.

To boost the performance of an IC, increasing the capacitance (without adding extra source components) and reducing resistance of the energy path is desired. In particular, a simple structure with a very low resistance is required to provide the energy stored in the source components in the other sections of the circuit to the switching component of the particular section, the low resistance of the simple structure enabling the fly time of the stored energy to be lower than or equal to the switching transition time of the switching component.

To this end, in an exemplary embodiment, Applicants have designed a novel energy borrowing structure to supply energy, stored in source components and dedicated for load components included in another section of the IC, to a sinking component included in a particular section of the IC.

This energy borrowing structure has a very low predetermined resistance and, therefore, allows a high amount of energy to be provided through it with negligible loss. Further, due to the low predetermined resistance, Applicants' energy borrowing structure significantly reduces the fly time for providing the borrowed energy to the sinking component.

Figure 4:
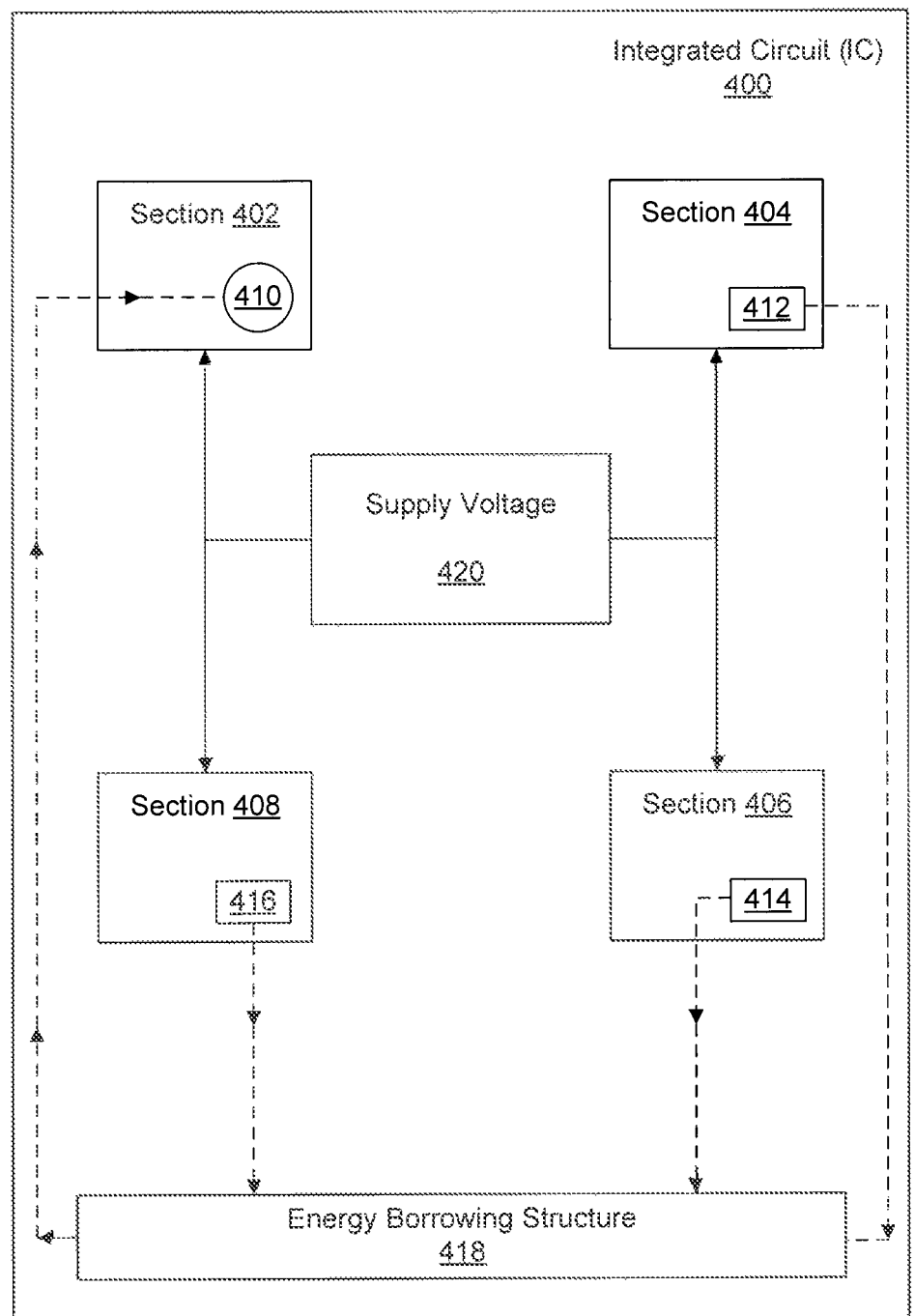
FIG. 4 illustrates a block diagram of an integrated circuit including the energy borrowing structure, according to an embodiment of the present invention.

FIG. 4 shows a block diagram of an integrated circuit 400, according to an embodiment of the invention, including an energy borrowing structure 418. The sinking component 410 included in section 402 of integrated circuit 400 sinks excessive current or voltage, thereby lowering the supply voltage 420 and creating a critical bottleneck which limits system performance of the IC 400.

The sinking component 410 may sink the excessive current in any mode of operation including off mode, standby mode, normal operation, damaged operation, etc.

To satisfy the requirements of the sinking component 410, the borrowing structure 418 provides a very low resistance path to supply the energy stored in the source components 412, 414, 416 of the another sections 404, 406, 408 to the sinking component 410, the energy stored in the source components 412, 416, 418 being dedicated for and/or utilized by respective load components included in the another sections 404, 406, 408.

In an exemplary embodiment, additional and/or unused energy stored in the source components 412, 416, 418 of the another sections 404, 406, 408 is provided to the sinking component 410, the additional and/or unused stored energy being dedicated for and/or utilized by respective load components included in the another sections 404, 406, 408.

Figure 5:
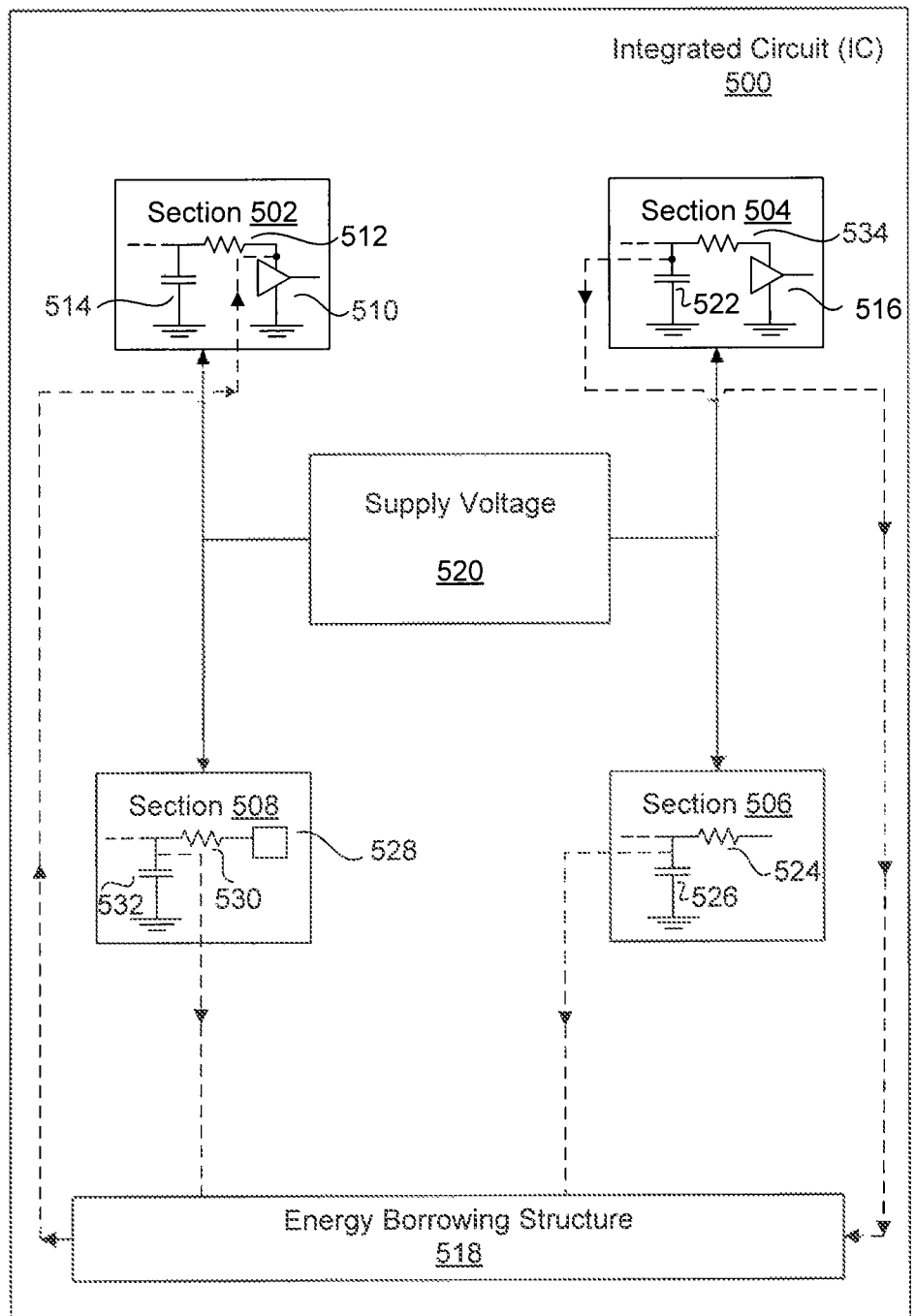
FIG. 5 illustrates exemplary components included in sections of the integrated circuit according to an embodiment of the present invention.

FIG. 5 shows an integrated circuit (IC) 500 according to an embodiment of the invention. Additional and/or unused energy is supplied from source components 522 (534), 526 (524), 532 (530) to sinking component 510 to satisfy the requirements of the sinking component 510. In an embodiment, in operation, the additional and/or unused energy stored in the source components 522 (534), 526 (524), 532 (530) is dedicated for and/or utilized by respective load components 516, 528 of the another sections 504, 506, 508.

As shown in FIG. 5, the additional and/or unused energy from source components 522 (534), 526 (524), 532 (530) located in sections 504, 506, 508 is supplied to the sinking component 510 located in section 502 via the energy borrowing structure 518, which has a very low resistance, thus allowing the requirements of the sinking component 510 to be satisfied.

In an exemplary aspect, in most cases, the charges stored in the source components 514 (512) are not enough to satisfy the requirement of the sinking component 510, leading to excessive sinking, thereby dragging down supply voltage 520.

Figure 6:
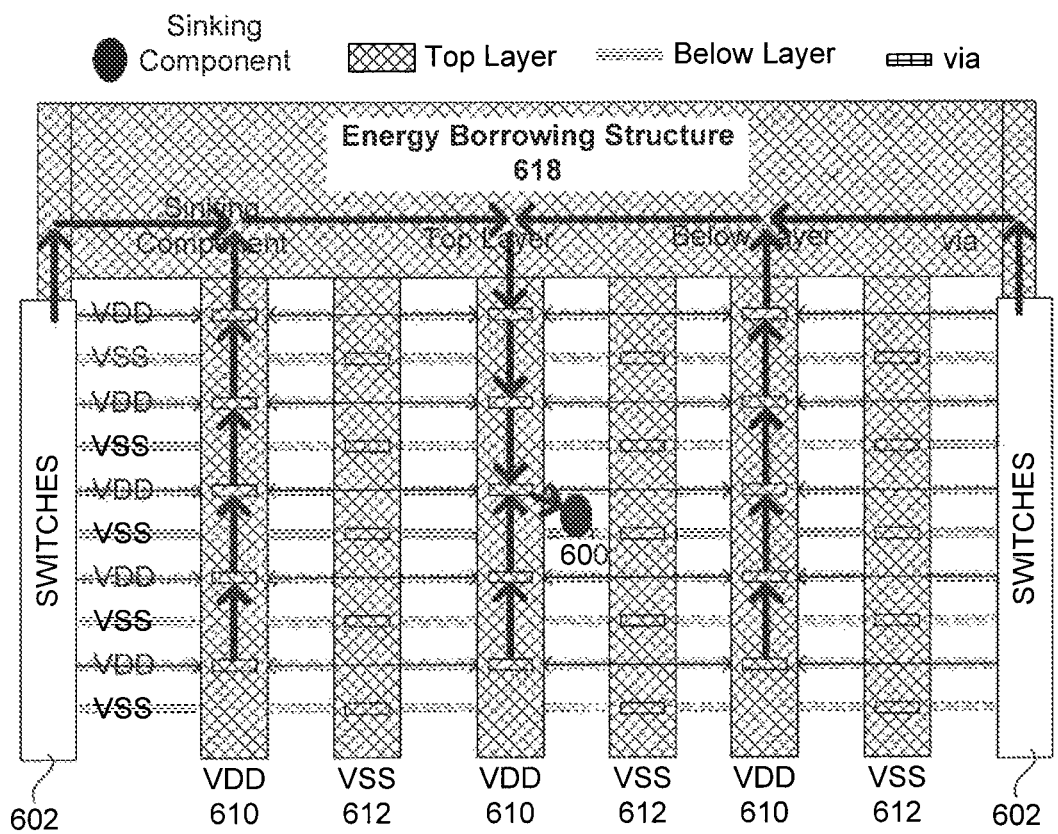
FIG. 6 illustrates the top view of an improved IC die layout of the integrated circuit according to an embodiment of the present invention.

FIG. 6 shows the top view of an improved IC die layout, of a power delivery network (PDN), including a power-ground mesh (610, 612) of the integrated circuit according to an embodiment of the present invention. The supplied energy now travels through the VDD routing on the lower layers to the VDD routing 610 on the top layer, through the energy borrowing structure 618, and then to the sinking component 600 through the VDD routing 610 closest to the sinking component 600.

The top layer has lower resistance than a lower layer because the top layer is wider and thicker than the lower layer. In an embodiment, the energy borrowing structure 618 has the same width and thickness as the top layer VDD routing 610.

In an embodiment, bridges are utilized to connect all VDD routings 610 to the energy borrowing structure 618. The bridges can be placed in channels/spaces between the different sections of the IC.

Now, the equivalent current path through which the supplied energy flows has very low resistance, and represents the path of least resistance for the flow of the supplied energy. This equivalent path allows the supplied energy to be provided to the sinking component with higher conductivity, therefore minimizing the loss of energy while being supplied through the energy borrowing structure 618.

Since top layer conductivity is much higher than lower layer conductivity, the supplied energy takes the path shown in FIG. 6 to reach the sinking component. In particular, because the top layer VDD routing 610 is connected to the energy borrowing structure 618, the supplied energy travels from the source components along the VDD routing on the lower layers to VDD routing 610 on the top layer and then to the energy borrowing structure 618. Finally, the supplied energy reaches the sinking component 600 through a top layer VDD routing 610 closest to the sinking component 600.

The utilization of the energy borrowing structure 618 allows the source components included in the another sections to be "closer" to the sinking component because the equivalent energy path significantly reduces the fly time for the supplied energy from these source components to reach the sinking component 600. As such, the energy borrowing structure 618 represents an equivalent to a low resistance and enables provision of adequate decoupling capacitance to satisfy the requirements of the sinking component 600.

The energy borrowing structure can be constructed in "white space" of the IC, which white space could be the space between two sections of the circuit or could be empty space reserved for another purpose. In an embodiment, the energy borrowing structure is constructed in a region of the IC that does not overlap with any sections of the IC which include components.

Further, in an embodiment, switches 602 may be provided to control operation of the energy borrowing structure 618. For example, the switches 602 may turn "on" or "off" the providing of the supplied energy through the energy borrowing structure 618.

Switches 602 can also be operated to further leverage the energy borrowing structure 618 and use energy stored at other (e.g., bigger) source components. For example, additional components (e.g., thin oxide decoupling capacitors) can be designed in the white space to provide better decoupling. However, if these additional components (thin oxide decoupling capacitors) are leaky, then there is a possibility that the requirements to satisfy the sinking component 600 may not be met. In this case, the switches 602 can be turned "on" to store energy on the bigger source components during "standby" or "free" time, and then be able to borrow this stored energy during "operation" or "busy" time. Therefore, the switches 602 can control storing of energy in the source components included in the another sections. The switches 602 can also be used to turn "off" operation of the additional components (leaky thin oxide decoupling capacitors) to minimize loss of energy due to leakage.

In this way, by providing stored energy from source components on other sections of the circuit to the sinking component of the particular section of the circuit, the bottleneck issue can be addressed and the supply voltage stabilized through the energy borrowing structure without the need to include additional source components in an existing design.

In an additional embodiment, the energy borrowing structure, acting as an equivalent current path with a very low resistance, provides the additional and/or unused energy to the switching component to enable the switching operation of the sinking component to start sooner, resulting in better overall performance of the IC.

Further, in another embodiment, the another section of the circuit, which includes the source component storing the additional and/or unused stored energy, operates in the same power domain or at the same voltage as the particular section including the sinking component. Also, the energy supplied from the source components via the energy borrowing structure can be AC current.

Applicants' energy borrowing structure also allows the worst case operation of the IC to be improved without affecting the average performance, thereby boosting the overall performance of the IC.

In an additional embodiment of the invention, one or more sinking components included within one or more particular sections can be supplied with additional and/or unused energy stored in one or more source components included in one or more another sections.

In a further exemplary embodiment of the invention, the particular section and the another sections of the integrated circuit can either be isolated from each other, connected directly to each other, comprised within each other, or connected to each other via a different section of the IC.

Also, the particular section and the another section can be sufficiently isolated from each other and/or serve different functionalities within the integrated circuit. For example, the particular section maybe the digital section of the IC and the another section maybe power section of the IC. However, the above examples of the digital section and the power section are not comprehensive, and can be any sections of the IC.

Table 1 shows data on an IC before (without) and after (with) providing the energy borrowing structure. As seen from the data, when other conditions (e.g., average current) are kept constant, the comparison shows that the peak to peak voltage at the sinking component with the energy borrowing structure can be 12 mV better than without the energy borrowing structure.

The maximum voltage (overshoot) the sinking component with the energy borrowing structure can be 4 mV better than without the energy borrowing structure, and the minimum voltage (undershoot) at the sinking component with the energy borrowing structure can be 8 mV better than without the energy borrowing structure.

As such, by constructing the energy borrowing structure, it is possible to improve the voltage drop in an IC by as much as 13%.

TABLE 1

| | Peak to Peak voltage | Max Voltage | Min Voltage | Average Voltage | Average Current |
|---|---|---|---|---|---|
| Before | 102 mV | 1.242 V | 1.140 V | 1.1872 V | 345 mA |
| After | 90 mV | 1.238 V | 1.148 V | 1.1873 V | 345 mA |
| Delta | 12 mV | 4 mV | −8 mV | −0.1 mV | 0 mA |

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An integrated circuit, comprising;
    a first section including a sinking component for sinking a current;
    at least one second section including at least one sourcing component configured such that in operation the at least one sourcing component has stored energy; and
    a structure configured to provide the stored energy from the at least one sourcing component to the sinking component,
    wherein, in operation, the stored energy is utilized by a load component included within the at least one second section.

2. The integrated circuit according to claim 1, wherein the structure has a predetermined resistance.

3. The integrated circuit according to claim 1, wherein the structure is physically located between two sections of the integrated circuit.

4. The integrated circuit according to claim 1, wherein the structure is located in an area that does not overlap with any area of the integrated circuit including components.

5. The integrated circuit according to claim 1, further comprising:
    a switch to control operation of the structure.

6. The integrated circuit according to claim 5, wherein the switch is configured to control operation of the structure by controlling providing of the stored energy by the structure.

7. The integrated circuit according to claim 1, wherein the first section and the at least one second section are isolated from one another and serve different functions within the integrated circuit.

8. The integrated circuit according to claim 1, wherein the load component is a switching component in the at least one second section.

9. The integrated circuit according to claim 1, wherein the sinking component is a transistor and the at least one sourcing component is a capacitor.

10. An integrated circuit, comprising:
a first section including a sinking means for sinking a current;
at least one second section including at least one sourcing means for controlling stored energy; and
a borrowing means for providing the stored energy from the at least one sourcing means to the sinking means,
wherein, in operation, the stored energy is utilized by a load means included within the at least one second section.

11. The integrated circuit according to claim 10, wherein the borrowing means has a low resistance.

12. The integrated circuit according to claim 10, wherein the borrowing means is located between two sections of the integrated circuit.

13. The integrated circuit according to claim 10, wherein the borrowing means is located in an area of the integrated circuit that does not overlap with any area of the integrated circuit including components.

14. The integrated circuit according to claim 10, further comprising:
a switching means for controlling operation of the borrowing means.

15. The integrated circuit according to claim 14, wherein the switching means controls operation of the borrowing means by controlling the stored energy by the borrowing means.

16. The integrated circuit according to claim 10, wherein the first section and the at least one second section are sufficiently isolated and serve different functions within the integrated circuit.

17. The integrated circuit according to claim 10, wherein the load component is a switching component.

* * * * *